United States Patent [19]

Halon et al.

[11] 4,214,018
[45] Jul. 22, 1980

[54] METHOD FOR MAKING ADHERENT PINHOLE FREE ALUMINUM FILMS ON PYROELECTRIC AND/OR PIEZOELECTRIC SUBSTRATES

[75] Inventors: Bernard Halon, New York, N.Y.; Dorothy M. Hoffman, Titusville, N.J.

[73] Assignee: RCA Corporation, New York, N.Y.

[21] Appl. No.: 933,603

[22] Filed: Aug. 14, 1978

[51] Int. Cl.² .................. H04R 17/00; B05D 5/12
[52] U.S. Cl. .................. 427/100; 427/124; 427/250; 427/314; 427/398.4; 29/25.35
[58] Field of Search .......... 427/100, 124, 250, 398 C, 427/314; 29/25.35

[56] References Cited

U.S. PATENT DOCUMENTS

| | | | |
|---|---|---|---|
| 3,123,493 | 3/1964 | Brick | 427/250 |
| 3,341,362 | 9/1967 | Hacskaylo | 427/100 |
| 3,468,120 | 9/1969 | Nageo et al. | 427/100 |
| 3,498,818 | 3/1970 | Bahm | 427/100 |
| 3,562,604 | 2/1971 | Van Laer | 427/100 |
| 3,912,830 | 10/1975 | Murayama | 427/100 |
| 4,049,859 | 9/1977 | Yoshikawa | 427/100 |
| 4,056,650 | 11/1977 | Dates | 427/314 |

OTHER PUBLICATIONS

Hoffman et al., *Pro. of . . . Frequency Control,* "The Structure & Properties of Thin Metal Films", (1974), pp. 85-88.

*Primary Examiner*—Michael F. Esposito
*Attorney, Agent, or Firm*—Birgit E. Morris; A. Stephen Zavell

[57] ABSTRACT

A method of forming an adherent pinhole free aluminum film on a pyroelectric and/or piezoelectric substrate comprising heating said substrate to from about 150° C. to about 350° C. at a pressure of from about $1 \times 10^{-4}$ Torr to about $1 \times 10^{-6}$ Torr for a sufficient time to desorb any gas molecules on the surface on said substrate, cooling said substrate with dry oxygen to about 125° C. at a pressure of about $1 \times 10^{-4}$ Torr and thereafter, terminating the flow of oxygen and further reducing the pressure to about $1 \times 10^{-5}$ Torr or lower and evaporating an aluminum film on said substrate.

10 Claims, 1 Drawing Figure

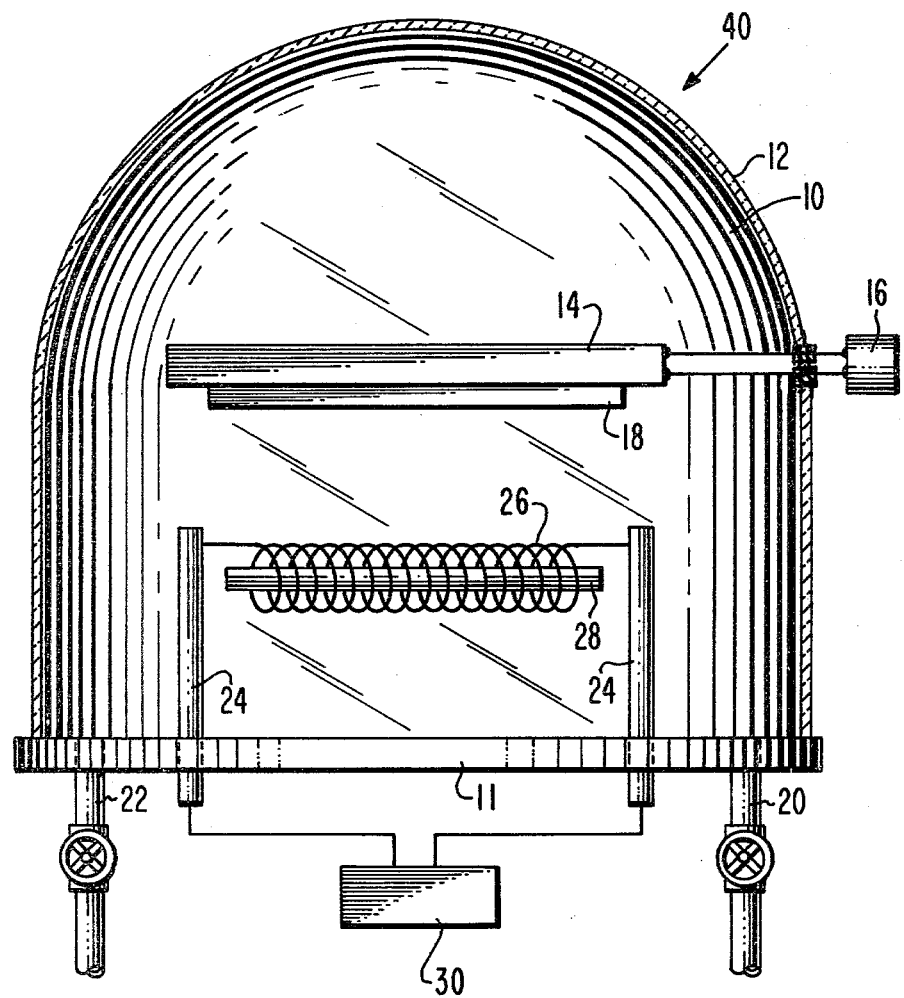

METHOD FOR MAKING ADHERENT PINHOLE FREE ALUMINUM FILMS ON PYROELECTRIC AND/OR PIEZOELECTRIC SUBSTRATES

This invention relates to a method of forming an aluminum film on a substrate. More particularly, this invention relates to a method of forming by vacuum deposition an adherent pinhole free aluminum film on a pyroelectric and/or piezoelectric substrate.

BACKGROUND OF THE INVENTION

The fabrication of electronic devices such as transistors or surface acoustic wave transducers often requires the deposition of an aluminum film on a substrate. The formation of said films on substrates which are stable at high temperatures such as sapphire, quartz, silicon, etc. is known. Generally, the methods employ temperatures in excess of 250° C. Optionally, known methods may incorporate a low temperature deposition process, i.e., temperatures in excess of 150° C., but with an initial high temperature step to provide an oxide layer which will tightly adhere a subsequently deposited aluminum film to the substrate.

When the electronic device incorporates a piezoelectric compound, the compound is deposited on an aluminum film which has been previously deposited on a substrate which is stable at high temperatures. Direct deposition of an adherent pinhole free aluminum film on a piezoelectric and/or pyroelectric substrate is extremely difficult due to the nature of the substrate.

A piezoelectric substrate is defined as a substrate which exhibits the formation of an electrical current when pressure is exerted on the substrate. The deposition of an aluminum film on a piezoelectric substrate can exert sufficient pressure to electrically charge the surface of the substrate and create many problems with the attempted application of a pinhole free aluminum film.

A pyroelectric substrate is defined as a substrate which undergoes thermal deformation with an accompanying change in electronic properties upon heating. A pyroelectric material is a sub-group of piezoelectricity as taught by Cady in *Piezoelectricity* (1946), McGraw Hill. Aluminum films deposited on the pyroelectric surface, although tending to appear smooth, may contain pinholes which appear by blowing a jet of gas on the surface of said substrate, or when the deposited aluminum film is viewed under high power optical magnification.

A pyroelectric and piezoelectric substrate is a substrate which exhibits both of the above properties. Thus, a method which can deposit adherent pinhole free films onto pyroelectric and/or piezoelectric substrates would be highly desirable.

SUMMARY OF THE INVENTION

We have invented a method of depositing an adherent pinhole free aluminum film on a pyroelectric and/or piezoelectric substrate comprising heating said substrate to about 150° C. to about 350° C. at a pressure of about $1 \times 10^{-4}$ Torr to about $1 \times 10^{-6}$ Torr for a sufficient time to desorb any gas molecules on the surface of said substrate, cooling said substrate with dry oxygen to about 125° C. at a pressure of about $1 \times 10^{-4}$ Torr and thereafter, terminating the flow of oxygen and further reducing the pressure to about $1 \times 10^{-5}$ Torr or lower and evaporating an aluminum film on said substrate.

BRIEF DESCRIPTION OF THE DRAWING

The FIGURE is a schematic representation of a possible apparatus for practicing our method of depositing an aluminum film on a pyroelectric and/or piezoelectric substrate.

DETAILED DESCRIPTION OF THE INVENTION

Our method will be more clearly illustrated by referring to the apparatus 40 in the FIGURE. A vacuum chamber 10 or vacuum evaporation chamber is defined by a bell jar 12 and a base 11. The substrate heater 14 which may be supported in the chamber by any suitable means is connected outside chamber 10 to an electrical power source 16. The electrical power source 16 may be any conventional electrical circuit which is controllable and can supply a predetermined amount of electric current to heat the substrate heater 14. The substrate 18 is connected to the substrate heater 14 by conventional means known in the art to provide a sufficient contact to provide the heating thereof.

The substrate 18 may be a piezoelectric material such as barium titanate, beryllium oxide, zinc oxide, lithium niobate, lithium tantalate, lithium vanadate, and the like, or a pyroelectric and piezoelectric substrate such as, inter alia, tourmaline, lithium sulphate, lithium selenate, lithium trisodium selenate, lithium sodium sulphate, and potassium lithium sulphate. Our method requires oxygen containing compounds if the deposited aluminum film is to be free of pinholes.

An outlet 20 is connected to a vacuum pump not shown sufficient to reduce the pressure in vacuum chamber 10 to at least about $1 \times 10^{-6}$ Torr and preferably as low as $1 \times 10^{-7}$ Torr. Initially, the substrate 18 is heated to a temperature of from about 150° C. to about 350° C. at a pressure of from about $1 \times 10^{-4}$ Torr to about $1 \times 10^{-6}$ Torr for a sufficient time to desorb any gas molecules on the surface of the substrate 18. About 30 minutes is usually sufficient to desorb gas molecules on the surface of the substrate 18. The time necessary to desorb the gas molecules is inversely proportional to the substrate temperature, i.e., the higher the substrate temperature the shorter the time period needed to desorb gas molecules on the substrate surface.

After the desorption of the gas molecules on the substrate surface, a gas inlet 22 bleeds dry oxygen into the vacuum chamber 10 to cool the substrate to about 125° C. The partial pressure of the oxygen used for cooling the substrate is from about $1.5 \times 10^{-1}$ Torr to about $1.0 \times 10^{-4}$ Torr.

Supports 24, made out of any metal known in the art which exhibits a low resistivity, are connected to a loop tungsten wire 26 for holding an aluminum rod 28 which is to be vacuum evaporated onto the cooled substrate 18. The tungsten wire 26 may be heated from a power source 30 outside the vacuum chamber 10 to evaporate the aluminum film onto said substrate 18. The initial rate of aluminum evaporation can be from about 1 to about 1000 angstroms per second at a partial oxygen pressure of from about $1.0 \times 10^{-6}$ Torr to about $1.0 \times 10^{-3}$ Torr. If the initial partial pressure of oxygen gas during the deposition of the aluminum film is fairly high, i.e., about $1 \times 10^{-3}$ Torr then the initial deposition rate of the aluminum should be about 1000 angstroms per second. However, if the initial partial pressure of oxygen is about $1 \times 10^{-6}$ Torr, with the partial pressure of the other residual gases in the system lower than that of oxygen, then the initial rate of aluminum deposition should be at least 1 angstrom per second. If the initial partial pressure of the oxygen at the start of the aluminum deposition is about $1 \times 10^{-5}$ Torr then the rate of deposition of aluminum should be at least 10 angstroms per second.

Within the given ranges for the partial pressure of oxygen and the rate of aluminum deposition, the rate of aluminum deposition is proportional to the partial pressure of oxygen gas, i.e., a high pressure requires high initial deposition rate. Although the oxygen concentration can be lower than the ranges given above, oxygen concentrations higher than the above specified values will produce insulating aluminum oxide films.

Initially heating the substrate to 350° C. for about 30 minutes followed by cooling to about 125° C. prior to the deposition of the aluminum film or introducing partial pressure of oxygen within our previously described range without initially heating the substrate to desorb gas molecules results in a film which is not adherent or pinhole free.

Aluminum films evaporated onto the substrate according to our method are sufficiently adherent to pass the military adherence test MIL/N/13508C 3.9 and 4.46. The tests generally involve cutting a section of cellophane tape and pressing it on to the aluminum coated substrate and thereafter pulling the tape off the substrate. Aluminum films which have not adhered well to the substrate surface will be pulled off by the cellophane tape.

The invention will be further illustrated by the following Example but it is to be understood that the invention is not meant to be limited solely to the details described therein.

A three centimeter square, 1 millimeter thick lithium niobate substrate is placed in a vacuum chamber. The substrate is heated to about 300° C. and the pressure in the vacuum chamber is about $1 \times 10^{-5}$ Torr. After 30 minutes the substrate is cooled to 125° C. by bleeding oxygen into the vacuum chamber at a partial pressure of $1 \times 10^{-2}$ Torr. When the substrate temperature reaches 125° C. the supply of oxygen into the vacuum chamber is stopped and the vacuum chamber is further evacuated such that the partial pressure of oxygen is reduced to about $1.0 \times 10^{-5}$ Torr. An aluminum film is evaporated onto the substrate to a thickness of about 1000 angstroms at a deposition rate of about 10 angstroms per second. The aluminum film is sufficiently adherent to pass the scotch tape test.

We claim:

1. A method of forming an adherent pinhole free aluminum film on a substrate comprising:
   heating an oxygen containing piezoelectric substrate to from about 150° C. to about 350° C. at a pressure of from about $1 \times 10^{-4}$ Torr to about $1 \times 10^{-6}$ Torr for a time sufficient to desorb any gas molecules on the surface of said substrate;
   cooling said substrate with dry oxygen to about 125° C. with a partial oxygen pressure of from about $1 \times 10^{-1}$ Torr to about $1 \times 10^{-4}$ Torr;
   terminating the flow of oxygen and further reducing the pressure to about $1 \times 10^{-5}$ Torr or lower; and
   evaporating an aluminum film on said substrate.

2. A method according to claim 1 wherein the piezoelectric substrate is selected from the group consisting of barium titanate, beryllium oxide, zinc oxide, lithium niobate, lithium tantalate, and lithium vanadate.

3. The method according to claim 1 wherein the piezoelectric substrate is pyroelectric.

4. A method according to claim 3 wherein the substrate is selected from the group consisting of tourmaline, lithium sulphate, lithium selenate, lithium trisodium selenate, lithium sodium sulphate, and potassium lithium sulphate.

5. The method according to claim 1 wherein the time necessary to desorb the gas molecules from the surface of said substrate is inversely proportional to the substrate temperature.

6. The method according to claim 5 wherein the time for the desorption of gas molecules is about 30 minutes.

7. The method according to claim 1 wherein the aluminum is evaporated onto said substrate from about 1 to about 1000 angstroms per second.

8. The method according to claim 7 wherein the partial pressure of the oxygen is from about $1.0 \times 10^{-6}$ Torr to about $1.0 \times 10^{-3}$ Torr.

9. The method according to claim 8 wherein the aluminum evaporation is about 10 angstroms per second with an initial partial pressure of oxygen of about $1 \times 10^{-5}$ Torr.

10. The method according to claim 1 wherein the evaporation rate of the aluminum onto the substrate is proportional to the initial partial pressure of oxygen.

* * * * *